(12) United States Patent
Urano

(10) Patent No.: US 7,869,675 B2
(45) Date of Patent: Jan. 11, 2011

(54) LIGHT EMITTING DEVICE

(75) Inventor: Youji Urano, Ikeda (JP)

(73) Assignee: Panasonic Electric Works Co., Ltd., Kadoma-shi (JP)

( * ) Notice: Subject to any disclaimer, the term of this patent is extended or adjusted under 35 U.S.C. 154(b) by 0 days.

(21) Appl. No.: 12/733,400

(22) PCT Filed: Aug. 28, 2008

(86) PCT No.: PCT/JP2008/065453

§ 371 (c)(1), (2), (4) Date: Feb. 26, 2010

(87) PCT Pub. No.: WO2009/028628

PCT Pub. Date: Mar. 5, 2009

(65) Prior Publication Data

US 2010/0163914 A1 Jul. 1, 2010

(30) Foreign Application Priority Data

Aug. 28, 2007 (JP) .............................. 2007-221863

(51) Int. Cl.
*G02B 6/26* (2006.01)
(52) U.S. Cl. .............................. 385/39; 349/56; 349/61; 349/69; 349/70; 349/113; 385/14; 385/901
(58) Field of Classification Search .................... 349/56, 349/61, 69, 70, 113; 385/14, 39, 901
See application file for complete search history.

(56) References Cited

U.S. PATENT DOCUMENTS 6,530,698 B1 * 3/2003 Kuhara et al. .................. 385/88

(Continued)

FOREIGN PATENT DOCUMENTS

EP 1928030 A1 6/2008

(Continued)

OTHER PUBLICATIONS

Maseru Sugimoto et al., "Compact, durable, high-outputLED unit," Heisei 19 Nendo Dai 40 kai Proceedings of Annual Conference of the Illuminating Engineering Institute of Japan, Aug. 23, 2007, vol. 40, p. 190, with English abstract.

(Continued)

*Primary Examiner*—Jennifer Doan
(74) *Attorney, Agent, or Firm*—Edwards Angell Palmer & Dodge LLP

(57) ABSTRACT

A light emitting device, in which an encapsulation resin is disposed at a space confined between an optical member and a mounting substrate. This encapsulation resin is possibly made free from a void-generation therein. In this light emitting device, the optical member can be precisely positioned. An electrode disposed outside a color conversion member is possibly free from an improper solder connection. A ring gate is formed on the top surface of the mounting substrate outside of the optical member, and acts to position the color conversion member. The ring gate acts to prevent an overflowing liquid encapsulation resin from flowing to the electrode provided. The ring gate is provided with a plurality of centering projections which are spaced circumferentially along its inner circumference to position the color conversion member.

8 Claims, 14 Drawing Sheets

U.S. PATENT DOCUMENTS 6,712,529 B2 * 3/2004 Horio .................. 385/92
2007/0085103 A1 4/2007 Nishioka et al.

FOREIGN PATENT DOCUMENTS

| JP | 2003-152226 A | 5/2003 |
| JP | 2003-345268 A | 12/2003 |
| JP | 2005-101393 A | 4/2005 |
| JP | 2005-158949 A | 6/2005 |
| JP | 2007-116109 A | 5/2007 |
| JP | 2007-200727 A | 8/2007 |

OTHER PUBLICATIONS

International Search Report dated Sep. 22, 2008, issued on PCT/JP2008/065453.

* cited by examiner

FIG. 5
(a)
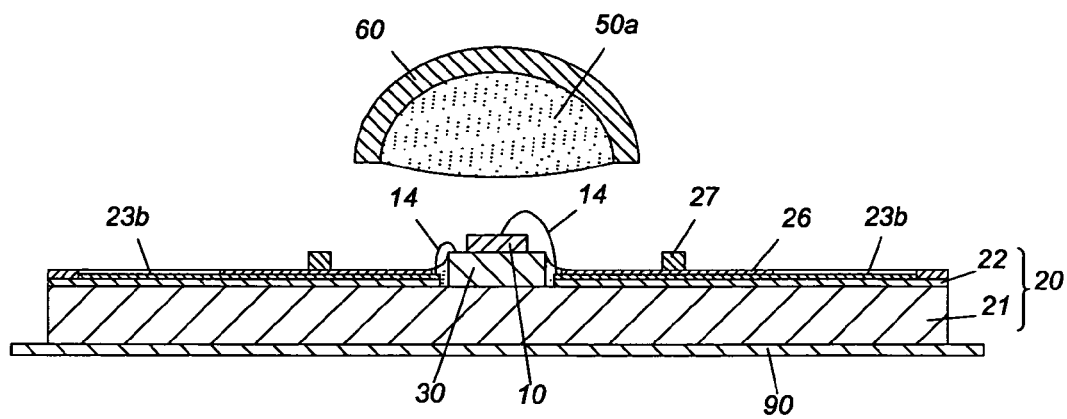
(b)
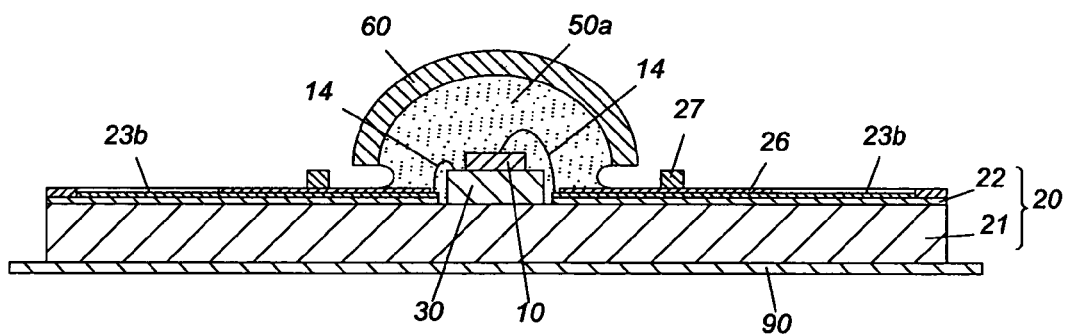
(c)
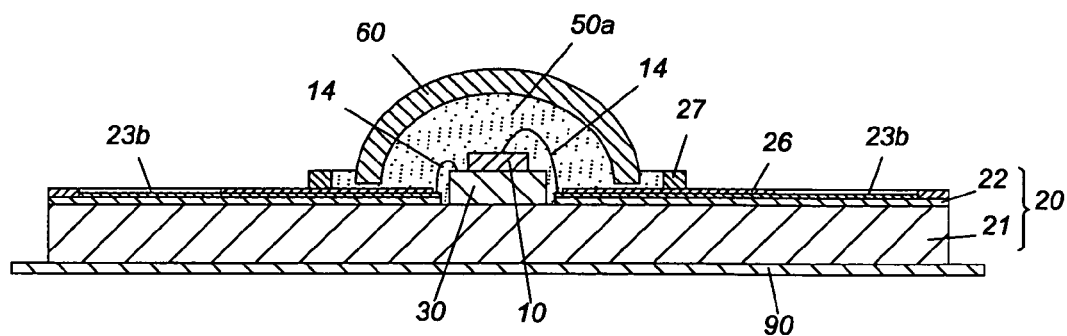

LIGHT EMITTING DEVICE

TECHNICAL FIELD

This invention relates to a light emitting device using LED chip (light emitting diode chip).

BACKGROUND ART

Many studies have been widely carried out to develop light emitting device so far. The light emitting device includes an LED chip and a phosphor. (e.g., Reference 1) The phosphor is employed as a wavelength conversion member which is excited by a light emitted from LED chip and radiates a light of color different from the luminescent color of the LED. The light emitting device is capable of radiating a light of mixed-color which is different from the luminescent color of LED, when including the phosphor and the LED chip. For example, the light emitting device is commercially available as a white-colored light emitting device (generally referred to as a white-color LED), in which the LED chip emitting blue-color or UV light is combined with the phosphor to give white-color light (white-color luminescent spectrum).

The reference 1 discloses one example of light emitting device shown in FIGS. 11 and 12. The light emitting device discloses an LED chip 110. a mounting substrate 120 mounting the LED chip thereon, an optical member (an output-magnifying portion) 160 shaped like convex lens covering the LED chip, and a dome-shaped color conversion member (wavelength conversion member) 170 containing a phosphor. The color conversion member is secured to the mounting substrate 120 to cover the optical member 160 therewith. The phosphor is excited by a light emitted from the LED chip and radiates a light of color different from the luminescent color of the LED chip 110.

In the light emitting device shown in FIGS. 11 and 12, the mounting substrate 120 is provided at its top surface with a recess 123 which accommodates an LED chip 110 and a portion of the optical member 160 therein. In this light emitting device, the LED chip 110 is flip-flop mounted within the recess 123 of the mounting substrate 120. In this light emitting device, the LED chip 110 in the recess 123 of the mounting substrate 120 is encapsulated with an encapsulating resin 150.

In the light emitting device shown in FIGS. 11 and 12, the mounting substrate 120 is provided at its top surface with an annular groove 129 which surrounds entirely the periphery of the recess 123. The annular groove 129 is designed to store therein an extra encapsulation resin which overflows outside in the process of filling the recess 123 with the encapsulating resin 150. The color conversion member 170 is secured at its bottom rim to engage with the annular groove 129, by means of the encapsulating resin filled within the annular groove 129.

In fabrication of the light emitting device shown in FIGS. 11 and 12, the annular groove 129 in the top surface of the mounting substrate 120 allows the encapsulation resin to be sufficiently injected into the recess 123 such that the encapsulating resin 150 is free from void-generation.

In the process of flip-flop mounting the LED chip 110 within the recess 123, electrodes of the LED chip 110 is positioned opposite to an inner bottom of the recess 123 of the mounting substrate 120. Then, the optical member 160 shaped like convex lens is disposed to cover the LED chip 110 therewith. In this process, it is difficult to set an optical axis of the optical member 160 to be matched with both that of the LED chip 110 and that of the color conversion member 170.

Besides, the light emitting device made in this process may decrease a light output, because a portion of the light leaking from a lateral face of the LED chip 110 is possibly absorbed into the mounting substrate 120, rather than directed outwardly.

In the light emitting device, the mounting substrate 120 is provided at its top surface with an annular groove 129. The mounting substrate 120 is provided at its bottom surface with a patterned conductor (not shown) which supplies electricity. When being configured to mount thereon the light emitting device acting as a light source of luminaire, the mounting substrate 120 needs to be disposed on a circuit substrate before accommodated in the main body of luminaire. But, the light emitting device in this configuration may suffer from an excessive thermal resistance between a light emitting part of the LED chip 110 and main body. As a result, this light emitting device luminaire needs to be controlled to receive a limited input electric power to the LED chip 110 such that a junction temperature of the LED chip 110 is kept below the maximum of junction temperature. Namely, this light emitting device may not give a high light output.

In the light emitting device shown in FIGS. 11 and 12, the mounting substrate 120 can be provided at its top surface with a patterned conductor. However, in the process of disposing the color conversion member 170 securely to the mounting substrate 120 in this configuration, an extra encapsulation resin overflowing from the groove 129 may flow to electrodes which are exposed outside of the color conversion member 170, eventually causing a poor solder connection.

In fabrication of the light emitting device shown in FIGS. 11 and 12, the encapsulation resin needs to be supplied into the recess 123 of the mounting substrate 120 engaging with a portion of the optical member 160 which is larger in external dimension than the LED chip 110. This light emitting device may suffer from void-generation inside the encapsulation resin 150, possibly giving a lowered light output.

References 2 and 3 disclose examples of light emitting devises shown in FIGS. 13 and 14, respectively. In each of the light emitting devices, the mounting substrate 120 is provided at its top surface with a gate 127. The gate 127 acts to prevent an extra encapsulation resin from flowing outside, in the process of encapsulating the LED chip 110 and bonding wires 114 (not shown in FIG. 13) with the encapsulation resin 150. The gates 127 in FIGS. 13 and 14 are formed of a black resist and an epoxy resin, respectively.

In the light emitting devices in FIGS. 13 and 14, the encapsulation resin 150 may extend over the gate 127, although the gate 127 acts to define an external dimension of the encapsulation resin 150.

Reference 1: Japanese unexamined patent publication 2005-158949 (paragraphs 0016 to 0017, FIGS. 3 and 4)
Reference 2: Japanese unexamined patent publication 2003-345268 (paragraphs 0009 to 0015, FIG. 5)
Reference 3: Japanese unexamined patent publication 2003-152226 (paragraphs 0018 to 0019, FIG. 3)

DISCLOSURE OF THE INVENTION

A light emitting device in the present invention has been accomplished in view of the above problem, and intended to suppress an improper solder connection at electrodes and to precisely position an optical member.

The light emitting device in the present invention comprises an LED chip, a mounting substrate mounting the LED chip, a dome-shaped optical member directing a light emitted from the LED chip therethrough, a light-transmissive encapsulation resin encapsulating the LED chip therewith, a dome-shaped color conversion member made of a transparent resin material and a phosphor, a patterned conductor making electrical connection with the LED chip, and a ring gate. The color conversion member is disposed on the top surface of the mounting substrate to surround the optical member therewith. The ring gate is formed to protrude from the top surface of the mounting substrate to separate the optical member from the electrodes. The ring gate enables to prevent the encapsulation resin from flowing to the electrode. The optical member is secured to a top surface of the mounting substrate to cover the LED chip therewith. The encapsulation resin is filled in a space confined between the optical member and the mounting substrate. The phosphor is excited by a light emitted from the LED chip to emit a light of a color different from a luminescent color of the LED chip. The patterned conductor is configured to have electrodes exposed outside of the color conversion member on the top surface of the mounting substrate. In the present invention, the ring gate is engaged at its outer circumference with the color conversion member. The ring gate is provided with a plurality of centering projections which are spaced circumferentially along its inner circumference to come into contact with an outer periphery of the optical member, so as to position the color conversion member.

The light emitting device in the present invention enables to prevent void-generation in the encapsulation resin, as well as allowing to precisely position the optical member. In this configuration, an inner circumference of the ring gate is spaced from the optical member. This configuration enables to prevent an extra encapsulation resin from flowing to the electrodes, thereby being free from improper solder connection at the electrodes. Compared to a conventional light emitting device in which the mounting substrate is provided with a recess receiving the LED chip and a portion of the optical member, the light emitting device in the present invention enables to suppress the reduction of light output resulting from light absorption in the mounting substrate, for efficiently directing light outward to give an improved light output.

In this invention, the color conversion member is preferably formed at inner peripheral bottom rim with a recess which engages with the ring gate, for being more precisely positioned. In this configuration, it is possible to shorten an interval between the color conversion member and the optical member.

More preferably, the ring gate is formed of a white resist in the present invention. The ring gate is prevented from absorbing the light which is emitted from the LED chip and the phosphor, enabling to achieve a high light output.

More preferably, the mounting substrate includes a heat conducting plate made of a heat conductive material and a printed substrate having an opening. A sub-mount member mounting the LED chip thereon is disposed directly on a top surface of the heat conducting plate to pass through the opening of the printed substrate. The opening of the mounting substrate is filled with the encapsulation resin around a periphery of the sub-mount member. The sub-mount member is configured to relieve a stress acting on the LED chip due to a difference of coefficient of linear expansion between the LED chip and the heat conducting plate, as well as thermally coupling the LED chip to the heat conducting plate. This configuration enables to prevent the LED chip from being broken due to the difference of coefficient of linear expansion between the LED chip and the heat conducting plate, thereby giving a highly reliable light emitting device. In this configuration, the sub-mount member is designed to be thick enough to prevent the light emitted from the LED chip, from being absorbed in the printed substrate, so as to achieve a high light output.

BRIEF DESCRIPTION OF THE DRAWINGS

FIG. 5 shows a step of filling a portion confined between an optical member and an LED chip, with a liquid encapsulation resin.

BEST MODE FOR CARRYING OUT THE INVENTION

Figure 1:
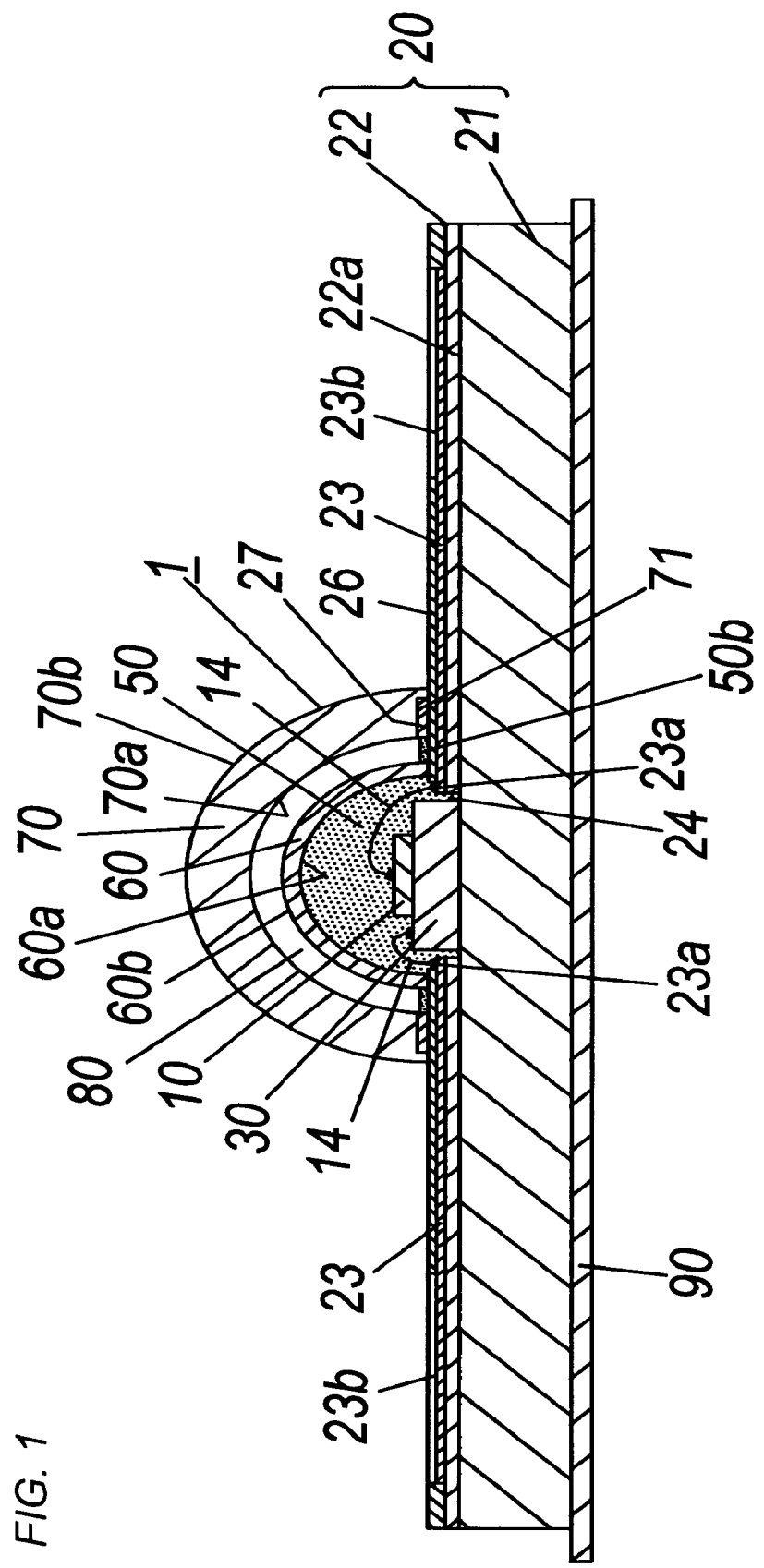
FIG. 1 shows a front sectional view of a light emitting device in the present invention, in accordance with one embodiment.

Hereafter, explanations are given as to a light emitting device in this embodiment, with reference to FIGS. 1 to 7.

The light emitting device 1 in this embodiment comprises an LED chip 10, a mounting substrate 20 shaped into a rectangular plate which holds the LED chip 10, a dome-shaped optical member 60 made of a light-transmissive material, a light-transmissive elastic encapsulation resin 50, and a dome-shaped color conversion member 70. The mounting substrate 20 is provided at its top surface with a ring gate 27. The ring gate 27 is formed outside of the optical member 60 to protrude from the top surface of the mounting substrate. The mounting substrate 20 is provided at its top surface with the LED chip 10 and a patterned conductor 23 which supplies electric power to the LED chip 10. The encapsulation resin 50 is filled in a space confined between the optical member 60 and the mounting substrate 20 for encapsulating therewith the LED chip 10 and a plurality of (two in this embodiment) bonding wirings 14 in electrical connection with the LED chip 10. The optical member 60 is secured to the top surface of the mounting substrate 20 to cover the LED chip 10 for directing a light emitted from the LED chip 10 therethrough. In the process of disposing the optical member 60 securely to the mounting substrate 20, an extra encapsulation resin overflows from the area confined between the optical member and the mounting substrate. The ring gate 27 prevents the extra encapsulation resin from flowing outside. The dome-shaped color conversion member 70 is a molded product made of a transparent resin material and a phosphor. The phosphor is excited by a light which is emitted from the LED chip 10 and then travels through the encapsulation resin 50 and the optical member 60, so as to emit a light of a color different from a luminescent color of the LED chip 10. The color conversion member 70 is disposed on the top surface of the mounting substrate 20, so as to surround the optical member 60 with an air layer 80 being interposed between the optical member 60 and the color conversion member 70.

The light emitting device 1 in this embodiment is provided at a bottom surface of the mounting substrate 20 with a sheet-shaped connecting member 90. The connecting member is made of a resin sheet which contains a filling material made of filler (such as silica and alumina) and exhibits a low viscosity when heated. (The resin sheet may be an organic green sheet such as an epoxy resin sheet highly filled with fused silica.) When utilized as a light source of a luminaire, the light emitting device 1 in this embodiment enables to connect a main body 100 (shown in FIGS. 3, 6, and 7) made of a metal (e.g., a highly thermally conductive metal such as Al and Cu) to the mounting substrate 20 by way of the connecting member 90. The resin sheet of the connecting member 90 exhibits very low electrical conductivity, high thermal conductivity, high fluidity when heated, and high adhesion to bumpy surfaces. In the process of connecting the mounting substrate 20 with the main body 100, the connecting member 90 is subjected to heat while being interposed therebetween. The connecting member enables to connect therethrough the mounting substrate 20 with the main body 100, without suffering from a void-generation, a rise in thermal resistance, and an ununiformity in thermal resistance which result from lack of adhesion. When interposed between the mounting substrate and the main body as in the light emitting device of this embodiment, the connecting member enables to minimize the thermal resistance between the LED chip 10 and the main body 100 for facilitating heat dissipation, compared to a conventional heat exhaustion rubber such as Sarcon (registered trademark). Besides, this connecting member enables to minimize ununiformity in the thermal resistance and the rise in junction temperature of the LED chip 10. With the use of connecting member, the light emitting device in this embodiment is allowed to accept an increased input electric power for giving a high light output. When being utilized as a light source of luminaire, a plurality of the light emitting devices are connected with each other in series or parallel on the main body 100.

The LED chip 10 is a GaN-based blue LED chip emitting a blue light. The LED chip 10 includes an electrically conductive n-type SiC substrate (which is employed as a crystal-growth substrate) having a lattice constant and a crystalline structure closer to those of GaN than sapphire substrate. The SiC substrate is formed at the main surface with a light emitting part by means of an epitaxial growth (e.g. MOVPE process). The light emitting part is made of a GaN-based semiconductor material and is obtained as a laminated structure, e.g. double-hetero structure. The LED chip 10 is provided at its top and bottom surfaces with an anode (not shown) and a cathode (not shown), respectively. Each of the cathode and anode is made of a high ohmic material (e.g., Al). The LED chip 10 may formed to have other structure, in accordance with the following way: the light emitting part of the LED chip 10 is provided on the main surface of the crystal-growth substrate by means of epitaxial growth, then disposed securely to a supporting base (e.g., Si substrate), and subsequently detached from the crystal-growth substrate.

The mounting substrate 20 is composed of a rectangular heat conducting plate 21 and a printed substrate 22 disposed on a top surface of the, heat conducting plate 21. The printed substrate 22 is formed at its middle position with a rectangular opening 24. The printed substrate 22 is formed of a rectangular flexible printed substrate which is secured to a securing sheet 29 (shown in FIG. 3) such as a polyolefin sheet. A rectangular sub-mount member 30 is disposed on a top surface of the heat conducting plate 21 to pass through the opening 24 of the printed substrate 22. The heat conducting plate 21 holds the LED chip 10 with the sub-mount member 30 being interposed therebetween. In this configuration, the heat generated from the LED chip 10 is allowed to be dissipated through the sub-mount member 30 and the heat conducting plate 21, and not introduced to the printed substrate 22. The heat conducting plate 21 is provided at its top surface with an alignment mark 21c which allows the sub-mount member 30 to be precisely positioned.

The heat conducting plate 21 is formed of Cu in this embodiment, but may be formed of any other thermally conductive material such as Al. The LED chip 10 in this embodiment is mounted to the heat conducting plate 21 such that the crystal-growth substrate of the LED chip is positioned closer to the heat conducting plate 21 than the light emitting part thereof is. The LED chip 10 may be mounted to the heat conducting plate 21 such that the light emitting part of the LED chip is positioned closer to the heat conducting plate 21 than the crystal-growth substrate thereof is. It is desirable that the LED chip 10 is mounted such that the crystal-growth substrate is positioned closer to the heat conducting plate 21 than the light emitting part is, for the purpose of giving an improved light output. The light emitting device may be prevented from giving a significantly reduced light output even when the light emitting part is positioned closer to the heat conducting plate 21 than the crystal-growth substrate is, because the crystal-growth substrate has almost the same refractive index as that of the light emitting part in this embodiment.

The printed substrate 22 includes a dielectric plate 22a. The dielectric plate 22a is made of a polyimide film. The dielectric plate 22a is provided at its top surface with a pair of the patterned conductors 23 which supplies electricity to the LED chip 10, and a protection layer 26 made of white resist (resin). The protection layer 26 is disposed to cover therewith portions of the dielectric plate 22a not formed with the patterned conductors 23, as well as the patterned conductors 23. The protection layer 26 is arranged to reflect outward a light which is emitted from a lateral face of the LED chip 10, and prevent the light from being absorbed into the printed substrate 22. With this arrangement, the light emitting device is allowed to efficiently direct outward the light, for giving an improved light output. Each of the patterned conductors 23 is formed into substantially rectangular shape, and has a dimension marginally smaller than half of dimension of the dielectric plate 22a. The dielectric plate 22a may be formed of FR4, FR5, paper phenol, or the like.

Figure 7:
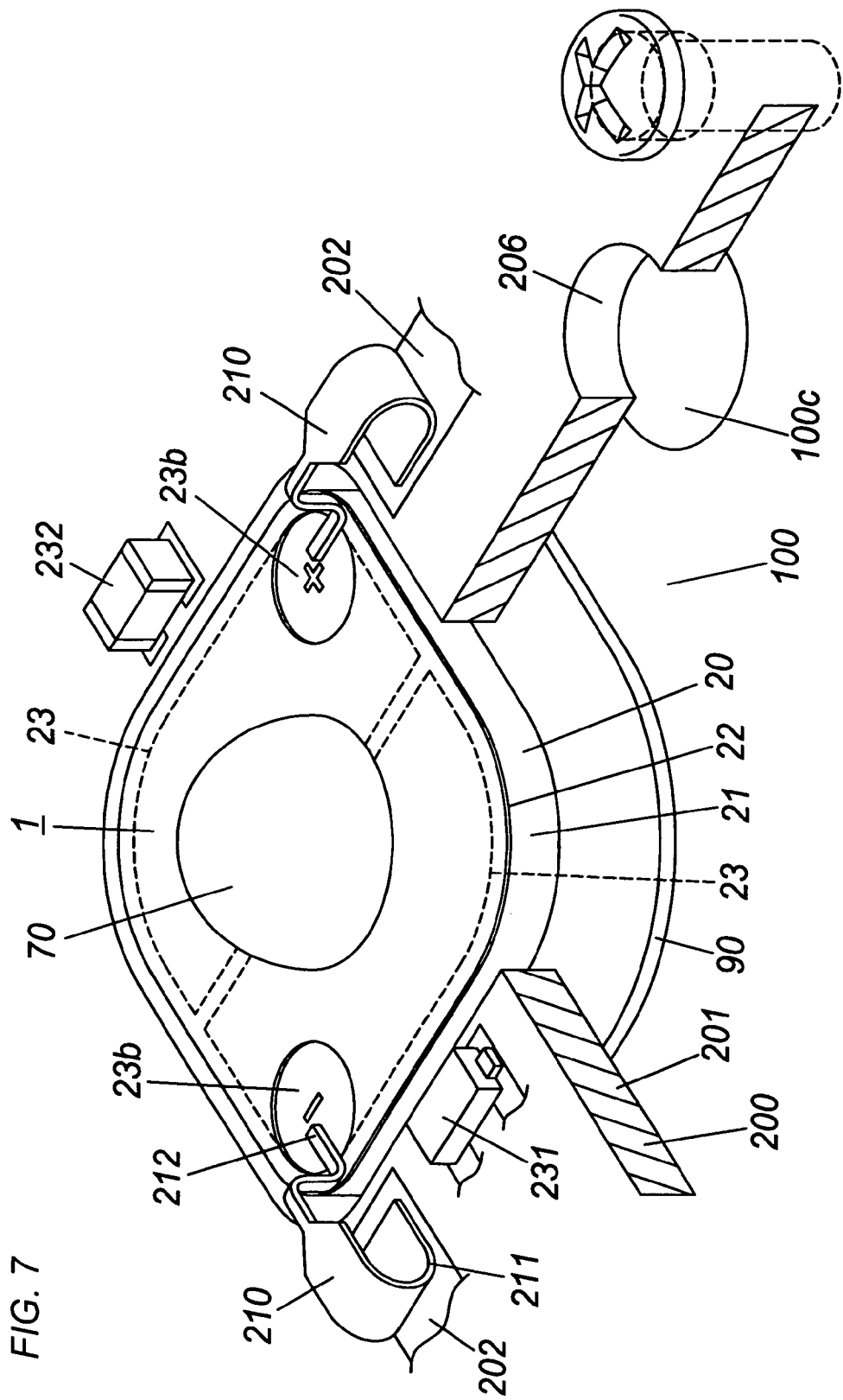
FIG. 7 shows a perspective view of essential part of a luminaire using the above light emitting device

The protection layer 26 is disposed to expose rectangular four terminal portions 23a of the patterned conductor 23 around a periphery of the opening 24, and two circular electrodes 23b near circumference of the printed substrate 22. The terminal portions 23a are respectively connected to bonding wires 14. Each patterned conductor 23 of the printed substrate 22 is formed of a laminate including Cu film, Ni film, and Au film. One of two electrodes 23b indicated by "+" (right one in FIG. 7 is electrically connected to the anode of the LED chip 10; the other indicated by "−" (left one in FIG. 7) is electrically connected to the cathode of the LED chip 10. The electrodes with signs of "+" and "−" are visually identified, and may be free from erroneous electrical connection thereof.

In the light emitting device 1 of this embodiment, the LED chip 10 is disposed to the heat conducting plate 21 with the sub-mount member 30 being interposed therebetween. The sub-mount member 30 acts to relieve stress acting on the LED chip 10 due to a difference of coefficient of linear expansion between the LED chip and the heat conducting plate. The sub-mount member 30 also acts to dissipate heat generated from the LED chip 10 to the heat conducting plate 21 which has a dimension larger than a chip size of the LED chip 10. The heat generated from the LED chip 10 can be efficiently dissipated through the sub-mount member 30 and the heat conducting plate 21. The sub-mount member is formed into rectangular plate having a dimension larger than the LED chip 10.

In this embodiment, the sub-mount member 30 is made of a dielectric AlN exhibiting relatively high thermal conductivity. The cathode is disposed on a bottom surface of the LED chip 10, and electrically connected to the patterned electrode (not shown). The patterned electrode is electrically connected to one of the patterned conductors 23 through the bonding wire 14 made of metal wire (e.g., Au wire, and Al wire). The anode is disposed on a top surface of the LED chip 10, and is electrically connected to the other of patterned conductors 23 of the mounting substrate 22 through the bonding wire 14. The LED chip 10 is connected to the sub-mount member 30 by way of solder of SnPb, AuSn, SnAgCu, Ag-paste, or the like. The LED chip is preferably connected to the sub-mount member by way of Pb-free solder such as AuSn and SnAgCu. When being formed of Cu and connected to the LED chip by way of AuSn, the sub-mount member needs to be formed at its bonding surface with a metal layer of Au or Ag in advance. In this case, the LED needs to be also formed at its bonding surface with a metal layer of Au or Ag in advance. The heat conducting plate 21 is preferably connected to the sub-mount member 30 by way of a Pb-free solder such as AuSn and SnAgCu. When being connected to the sub-mount member by way of AuSn, the heat conducting plate 21 needs to be formed at its bonding surface with a metal layer of Au or Ag in advance.

The material of the sub-mount member 30 is not limited to AlN, and may be a highly thermally conductive material having the linear thermal expansion coefficient nearly equal to that of crystal-growth substrate made of 6H—SiC. For example, a composite SiC, Si, Cu, or CuW may be employed as a material of the sub-mount member. The sub-mount member 30 is thermally conductive as described above. The surface of heat conducting plate 21 facing the LED chip 10 is preferably formed to have a dimension larger than the surface of the LED chip 10 facing the heat conducting plate 21.

In the light emitting device 1 of this embodiment, the sub-mount member 30 is arranged to be thick enough to have a top higher than that of the protection layer 26. This arrangement enables to achieve a high light output, because the light emitted from a lateral face of the LED chip 10 is prevented from being absorbed into the printed substrate 22 through an inner wall of the opening 24. When the sub-mount member 30 is provided with a reflection layer which is designed to reflect thereon the light emitted from the LED chip 10 for achieving a further improved light output, the light can be preventing from being absorbed in the dielectric substrate 30, after emitted from the LED chip 10. The reflection layer is formed of a laminate including a Ni film and an Ag film.

The encapsulation resin 50 is made of silicon resin, but may be made of other one such as acryl resin.

The optical member 60 is a dome-shaped molded article made of light-transmissive material (e.g., silicone resin and glass). In this embodiment, the optical member 60 is a molded article made of silicone resin, enabling to minimize differences in refractive index and linear expansion coefficient between the optical member 60 and the encapsulation resin 50. Preferably, the optical member 60 is made of an acryl resin when the encapsulation resin 50 is an acryl resin.

Preferably, the light output surface 60b of the optical member 60 is shaped into a convex surface such that an interface between the light output surface 60b and the air layer 80 is free from a total reflection of the light radiated from the light input surface 60a. In this embodiment, the optical member 60 is disposed such that the center of the light output surface lies on a line passing through an optical axis of the LED chip 10. After emitted from the LED chip 10, the light is allowed to easily travel to the color conversion member 70 through the encapsulation resin 50, the optical member 60, and an air layer 80. With this arrangement, the light emitting device enables to give an increased overall light flux. After emitted from lateral face of the LED chip 10 and passing through the encapsulation resin 50, the optical member 60, and an air layer 80, one portion of the light excites the phosphor inside the color conversion member 70, other portion of the light travels inside the color conversion layer 70 without colliding with the phosphor. The optical member 60 is designed to have a constant wall thickness over the entire surface.

The color conversion member 70 is a molded article made of a mixture of the light-transmissive material (e.g. silicone resin) and yellowish phosphor particles. Each phosphor particle is excited by a blue light emitted from the LED chip 10 to emit a broad yellow-light, (Namely, the color conversion member 70 contains phosphors). The light emitting device 1 in this embodiment enables to radiate the blue-light emitted from the LED chip 10 and the yellow-light emitted from the yellowish fluorescent material, through the, outer surface 70b of the color conversion member 70. This light emitting device 1 allows the blue-light and the yellow-light to be mixed with each other for giving a white-color light. The color conversion member 70 is made of silicone resin in this embodiment, but may be made of other light-transmissive material such as an acryl resin, a glass, an organic-inorganic hybrid material which is made of a mixture of organic and inorganic nano-particles or an organic-inorganic hybrid molecule including organic and inorganic moieties. The phosphor in the color conversion member 70 is the yellowish phosphor in this embodiment, but may be a combination of other fluorescent materials such as a combination of reddish and greenish ones for achieving white-color light.

The color conversion member 70 is shaped to fit to the light output surface 60b of the lens 60 such that an inner surface 70a of the color conversion member 70 is spaced from the light output surface 60b of the lens 60 by an almost uniform distance, and configured to have a constant wall thickness over the entire surface. The color conversion member 70 needs to be secured at its peripheral bottom rim to the mounting substrate 20 by means of adhesive agent (e.g., silicone resin and epoxy resin).

Figure 6:
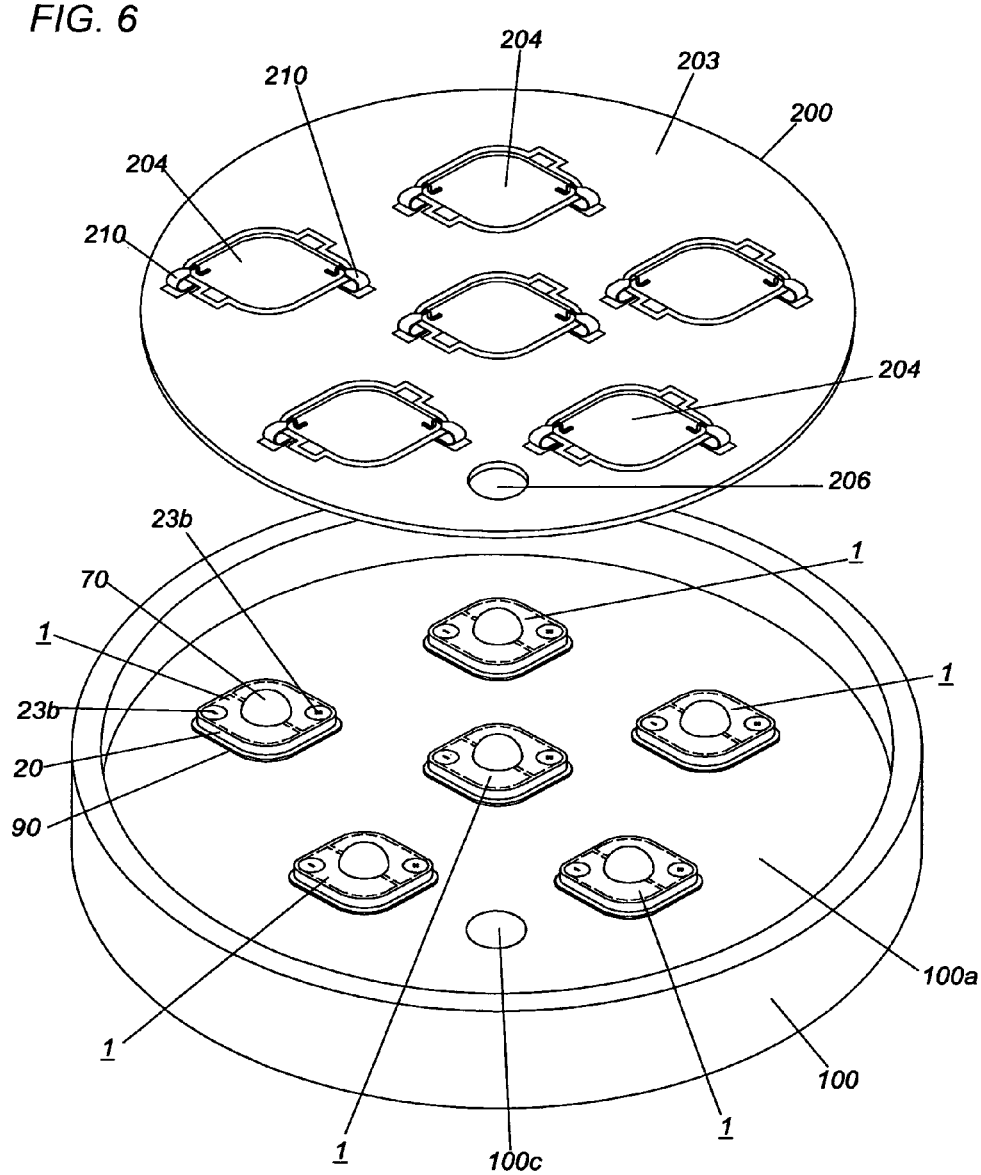
FIG. 6 shows an explored perspective view of essential part of a luminaire using the above light emitting device.

The luminaire in which the light emitting device 1 is utilized as a light source has a circuit substrate 200 including a dielectric board 201, as shown in FIGS. 6 and 7. The dielectric board 201 is provided at its top surface with patterned wiring 202 defining an electrical connection of a plurality of light emitting devices 1. A plurality of the light emitting devices 1 are connected with each other in series in this embodiment, but may be connected in parallel or connected in a series-parallel combination.

The circuit substrate 200 is disposed inside the main body 100 shaped like short cylinder so as to be spaced away from a bottom wall 100a of the main body 100. The circuit substrate 200 is formed with openings 204 for allowing a portion of each light emitting device to pass therethrough. The dielectric board 201 of the circuit substrate 200 may be made of a glass epoxy resin (e.g., FR4), a polyimide resin, or a phenol resin. The main body 100 may be formed into other shape such as plate-like.

The bottom wall 100a of the main body 100 is provided with an insertion opening 100c. The circuit substrate 200 is provided with an insertion opening 206. With this arrangement, the circuit substrate 200 is electrically connected to a pair of lead wiring which passes through the openings for electrical supply. The circuit substrate 200 is provided at its top surface remote from the bottom wall 100a of the main body, with a light-reflection layer 203 made of a white resist layer. The light-reflection layer 203 is configured to cover large part of patterned wiring 202 therewith.

The circuit substrate 200 is configured such that each of the openings 204 is marginally larger than a plane size of the mounting substrate 20 of each light emitting device. The circuit substrate 200 is provided nearby openings 204 with Zener diodes 231 (shown in FIG. 7) and ceramic condensers 232 which are disposed to protect the LED chip 10 of each light emitting device 1 from an excessive electric voltage applied thereto.

The light emitting device 1 is electrically connected to the patterned wiring 202 of the circuit substrate 200 through a terminal plate 210 of outer electrodes 23b of the mounting substrate 20. The terminal plate 210 is made of an elongated metal plate which is formed at its one end into a J-shape terminal 211 and at its other end into an L-shape terminal 212. The terminal 211 and the terminal 212 are respectively connected to the patterned wiring 202 and the electrode 23b by means of solder or like. These terminals are capable of relieving stress which acts on portions of the electrodes 23b and the patterned wiring 202 which are connected by way of the terminals 210 due to a difference of coefficient of linear expansion between the main body 100 and the circuit substrate 200. This arrangement enables to improve its bonding reliability between the light emitting device 1 and the circuit substrate 200.

The sheet-shaped connecting member 90 in the light emitting device 1 of this embodiment is formed to have a plane size larger than that of the heat conducting plate 21, enabling to increase a creepage distance between the heat conducting plate 21 and the main body (metallic member) 100, and eventually improving thunder-resistance surge, compared to a connecting member 90 having the same plane size as that of the heat conducting plate 21. (Outdoor luminaire is required to have a creepage distance different from that of indoor luminaire, between the light emitting device and the metallic member. Outdoor luminaire needs to have the creepage distance longer than that of the indoor luminaire.) The thickness of sheet-shaped connecting member 90 needs to be determined in accordance with a required pressure-resistance of the thunder-resistance surge. The sheet-shaped connecting member 90 is preferably formed thin for reducing a thermal resistance. Namely, the connecting member 90 needs to have a suitable thickness and a suitable plane size so as to meet the requirement of the creepage distance.

The light emitting device 1 can be fabricated in the following process. The LED chip 10 is electrically connected to the patterned conductors 23 by way of two bonding wires 14. Next, one portion of a liquid encapsulation resin (e.g., silicone resin) is poured through a hole 28 (which is formed continuously with the opening 24) to be filled inside the opening 24 of the printed substrate 22 around a periphery of the sub-mount member 30, so as to be cured to become one portion of the encapsulation resin 50. Next, the optical member 60 is filled at its interior with the other portion of the liquid encapsulation resin (e.g., silicone resin). Subsequently, the optical member 60 are suitably positioned on the mounting substrate 20, so as to be secured to the mounting substrate 20 while the liquid encapsulation resin is cured to become the encapsulation resin 50. Finally, the color conversion member 70 is secured to the mounting substrate 20. In the above fabrication example of the light emitting device, the liquid encapsulation resin needs to be provided to the interior of the optical member 60 sufficiently so as to prevent void-generation inside the encapsulation resin 50.

Figure 2:
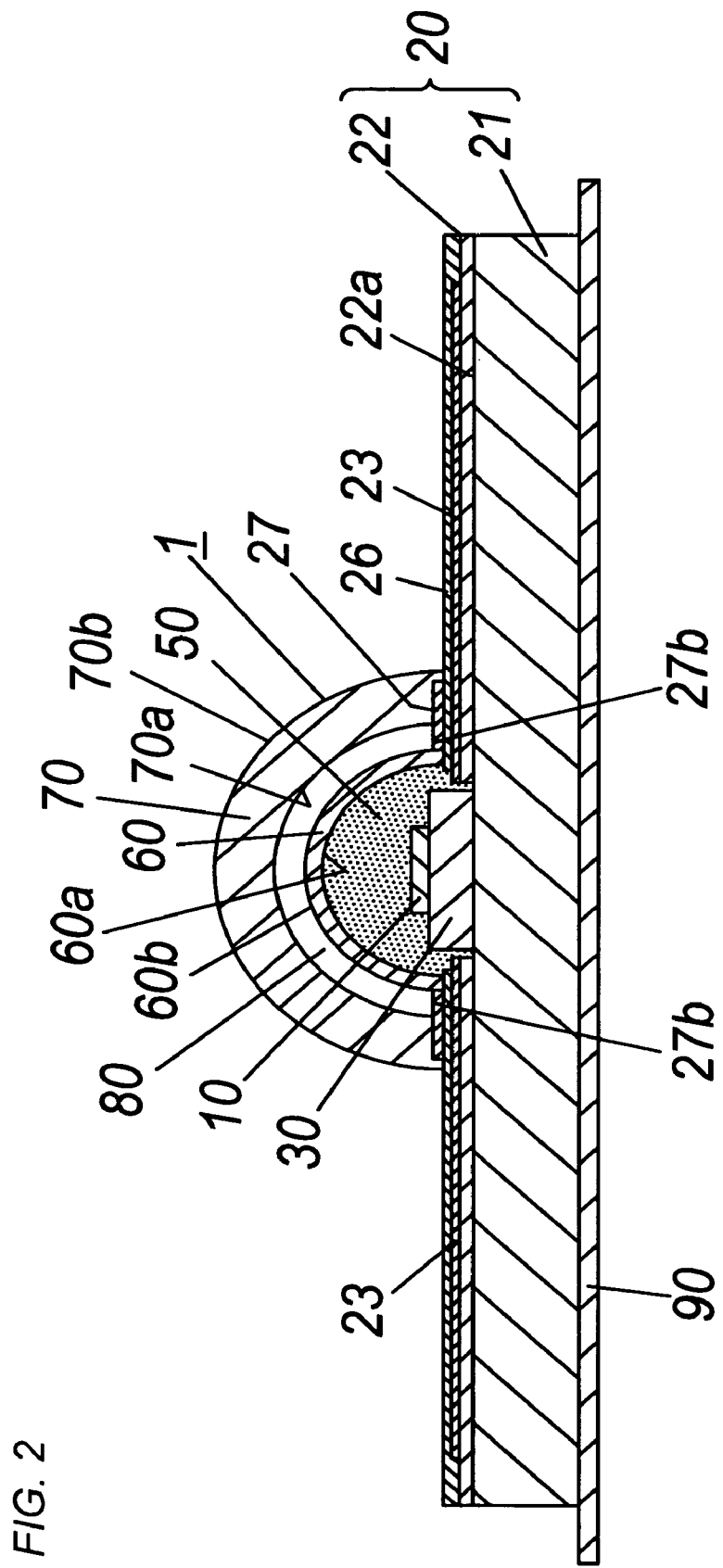
FIG. 2 shows a side sectional view of the above light emitting device.
Figure 3:
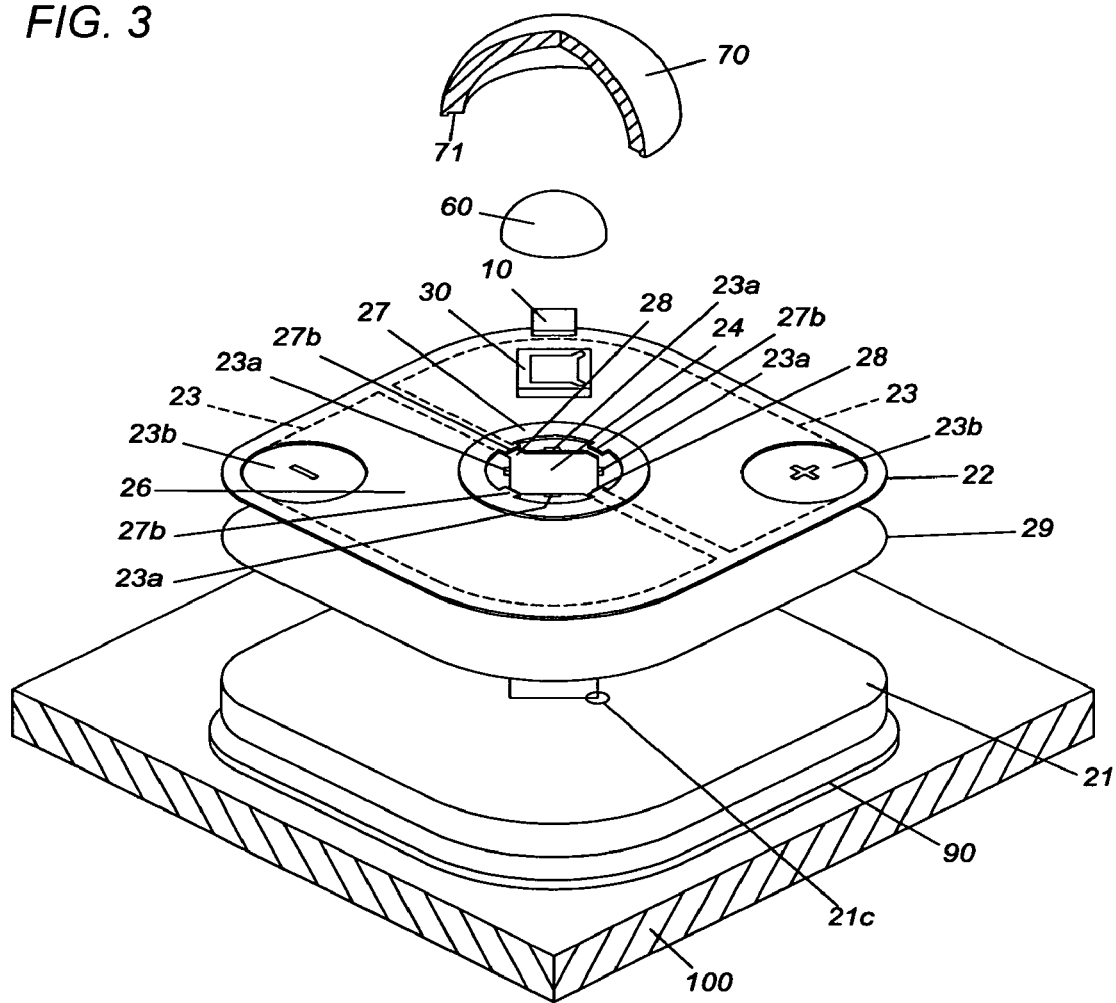
FIG. 3 shows an explored perspective view of essential part of a luminaire using the above light emitting device.
Figure 4:
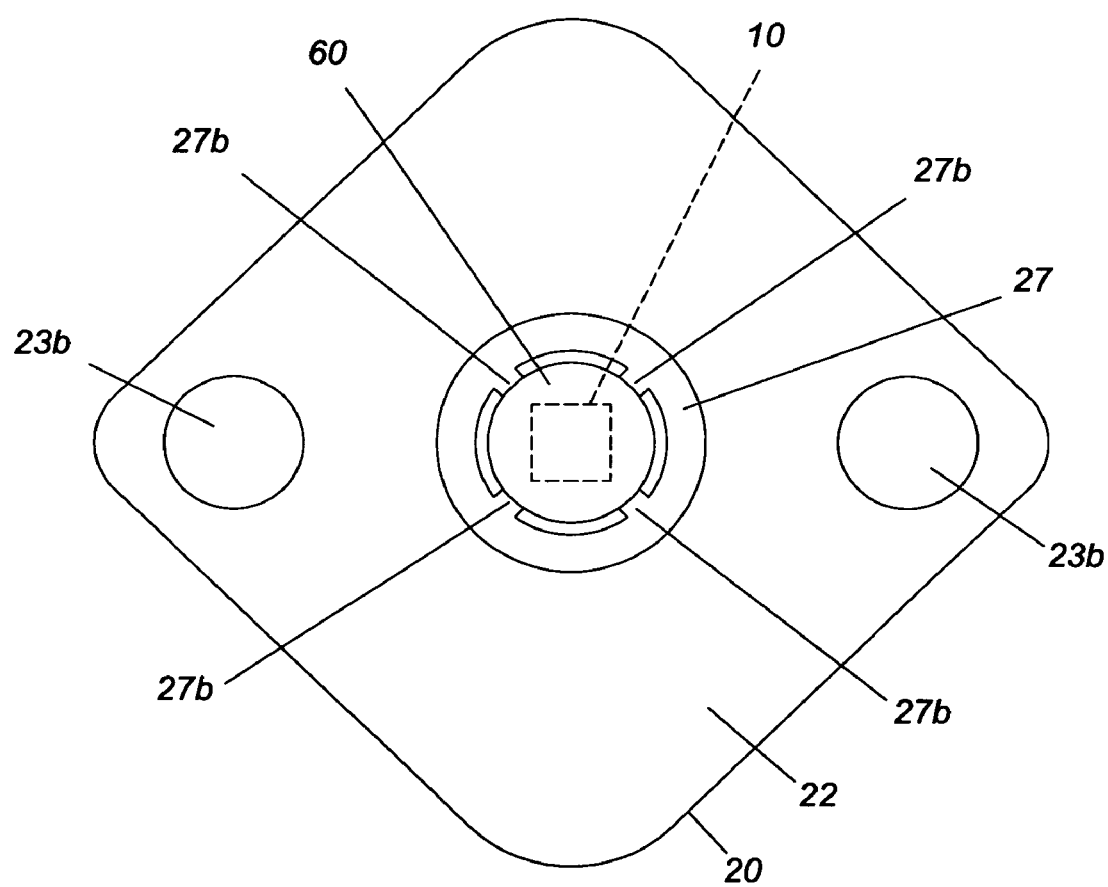
FIG. 4 shows a schematic plane view of essential part of the light emitting device.

In the light emitting device 1 in this embodiment, the mounting substrate 20 is provided at its top surface with the annular ring gate 27 which is formed to protrude therefrom outside of the optical member 60. In the process of disposing the optical member 60 securely to the mounting substrate 20, the ring gate 27 acts to prevent an extra liquid encapsulation resin which overflows from the portion confined between the optical member 60 and the mounting substrate 20, from flowing outside therethrough. The ring gate 27 is formed of a white resist. As shown in FIGS. 2 to 4, the ring gate 27 is provided with a plurality of (four in this embodiment) centering projections 27b extending inward from its inner circumference. These centering positions are equally spaced circumferentially along inner circumference of the ring gate, so as to locate around the center axis of the optical member 60. The ring gate 27 also acts to position the color conversion member 70. The number of the centering positions 27b is four in this embodiment, and preferably three or more. Each centering position 27b is preferably formed to have a small width such that the encapsulation resin can be stored in high amount into a portion confined between the ring gate 27 and the optical member 60.

The color conversion member 70 is formed at inner peripheral bottom rim with a recess 71 for engaging with the ring gate 27. The light emitting device in this embodiment allows to precisely position the color conversion member 70 in relation to the mounting substrate 20, as well as shortening an interval between the color conversion member 70 and the optical member 60. The recess 71 is formed across the inner peripheral bottom rim and inner face 70a.

The patterned conductor 23 on the mounting substrate 20 is exposed outside the color conversion member 70 so as to act as the electrodes 23b.

The light emitting device 1 in this embodiment can be fabricated in accordance with the following steps shown in FIG. 5 (a). First, the LED chip 10 is disposed to the mounting substrate 20 for electrical connection therebetween by means of the bonding wires 14. Next, one part of liquid encapsulation resin 50a (e.g., silicone resin) is poured through a hole 28 (which is formed integrally with the opening 24) to be supplied into the opening of the printed substrate around a periphery of the sub-mount member 30. Next, the optical member 60 is filled at its interior with the other part of liquid encapsulation resin as shown in FIG. 5 (a), and then positioned closely to the mounting substrate 20 as shown in FIG. 5 (b). Subsequently, the optical member 60 are suitably disposed on the mounting substrate 20, so as to be secured thereto as the liquid encapsulation resin 50a gets cured to become the encapsulation resin 50. Finally, the color conversion member 70 is secured to, the mounting substrate 20. As shown in FIG. 5 (a), the liquid encapsulation resin 50a (e.g., silicone resin) is poured into the dome-shaped optical member 60 in a predetermined amount larger than an interior volume thereof. The liquid encapsulation resin 50a inside a portion confined by the optical member 60, the ring gate 27, and the protecting layer 26 on the mounting substrate 20 is cured to become a resin portion 50b in FIG. 1.

In the above steps of fabricating the light emitting device, the encapsulation resin 50 hardly suffers from void-generation, enabling to provide a highly reliable light emitting device with an improved light output. After being poured through a hole into the opening of the printed substrate 22 around a periphery of the sub-mount member 30 as shown in FIG. 5 (a), one part of liquid encapsulation resin 50a is preferably cured in advance, so as to allow efficiently remove voids when the optical member 60 is positioned closely to the mounting substrate 20 as shown in FIG. 5 (b)

In fabrication of the light emitting device in this embodiment, it is possible to prevent void-generation inside the encapsulation resin 50, line breaking of bonding wire 14, and light output reduction. In fabrication of the light emitting device in this embodiment, it is also possible to precisely position the optical member 60. As being disposed away from the optical member 60, the ring gate 27 enables to prevent an extra liquid encapsulation resin 50a from flowing therethrough to electrode 23b, for being free from an improper solder connection at the electrode 23b.

In the light emitting device 1 of this embodiment, the ring gate 27 is formed of a white resist to be prevented from absorbing the light which is emitted from the LED chip 10 and phosphor, enabling to achieve an improved light output.

In the light emitting device 1 of this embodiment, the mounting substrate 20 is provided at its top surface with the patterned conductor 23, enabling to thermally coupling with the main body 100 of luminaire without mounting circuit substrate thereon, as well as suppressing the rise in junction temperature of the LED chip 10. The light emitting device 1 of this embodiment is allowed to receive an increased input electric power for achieving an improved light output.

Figure 8:
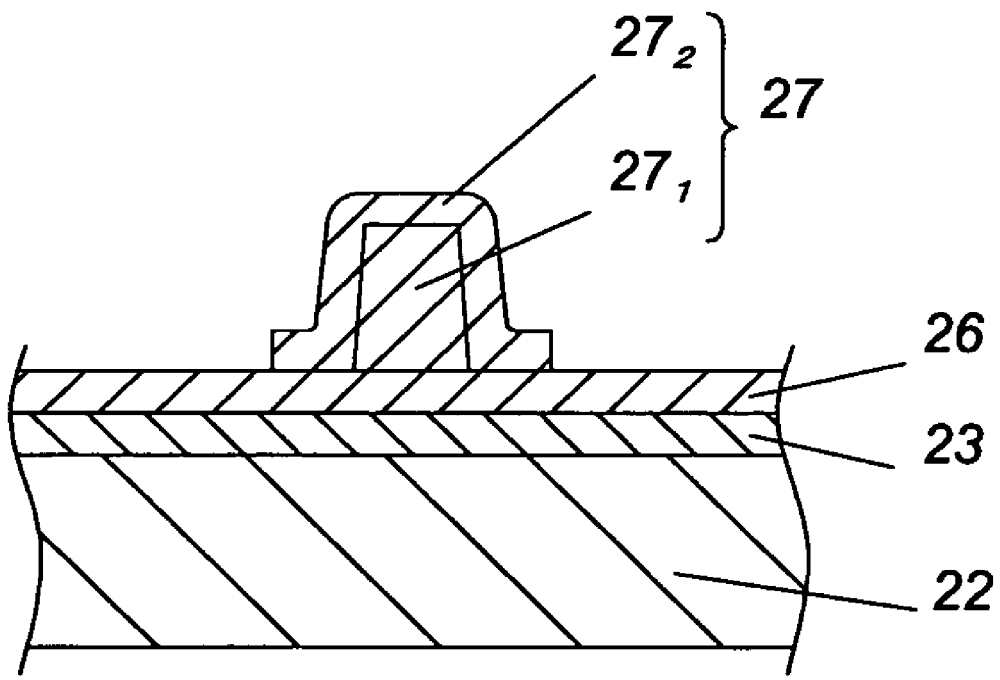
FIG. 8 shows a sectional view of essential part of an example of a ring gate in the above light emitting device.
Figure 9:
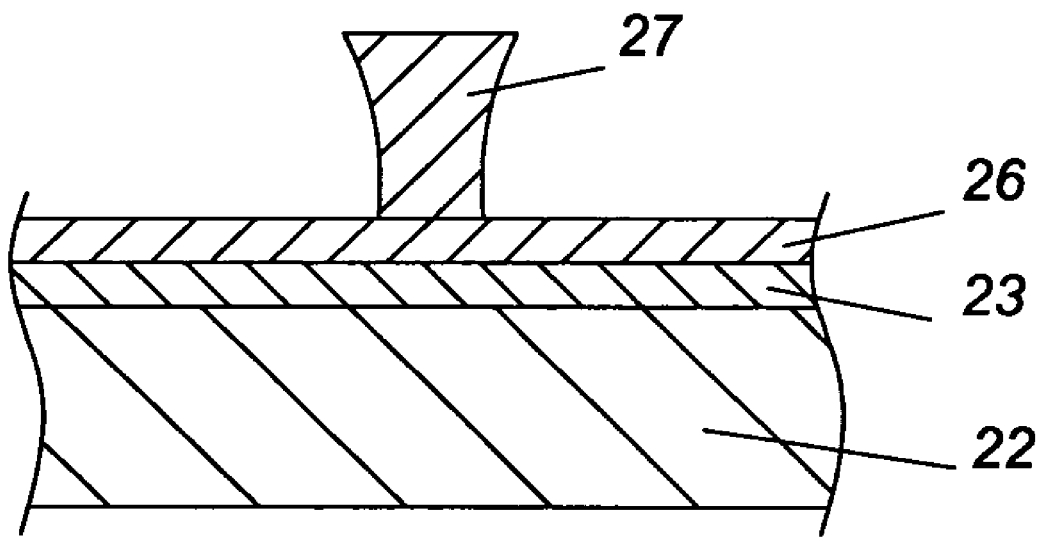
FIG. 9 shows a sectional view of essential part of another example of a ring gate in the above light emitting device.

The ring gate 27 is preferably set to have a height of 50 μm or more. For example, the ring gate 27 may be formed of a first resist layer 27₁ on the protecting layer 26 and a second resist layer 27₂ on the first resist layer 27₁, as shown in FIG. 8. Instead, the ring gate 27 may be formed to have curved lateral surfaces each having a width narrowing towards the protecting film 26, as shown in FIG. 9.

Figure 10:
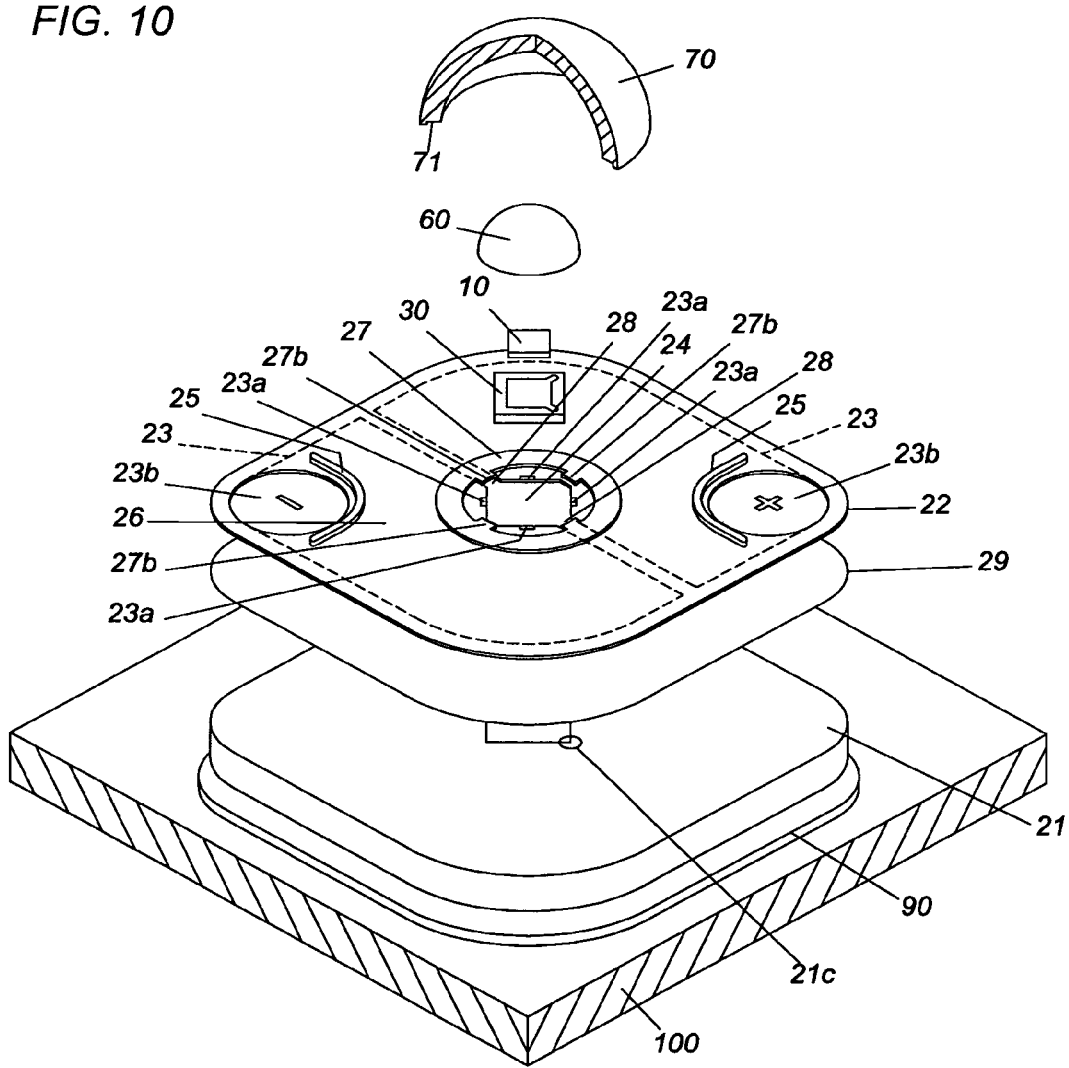
FIG. 10 shows an explored perspective view of essential part of a luminaire using another example of the above light emitting device.
Figure 11:
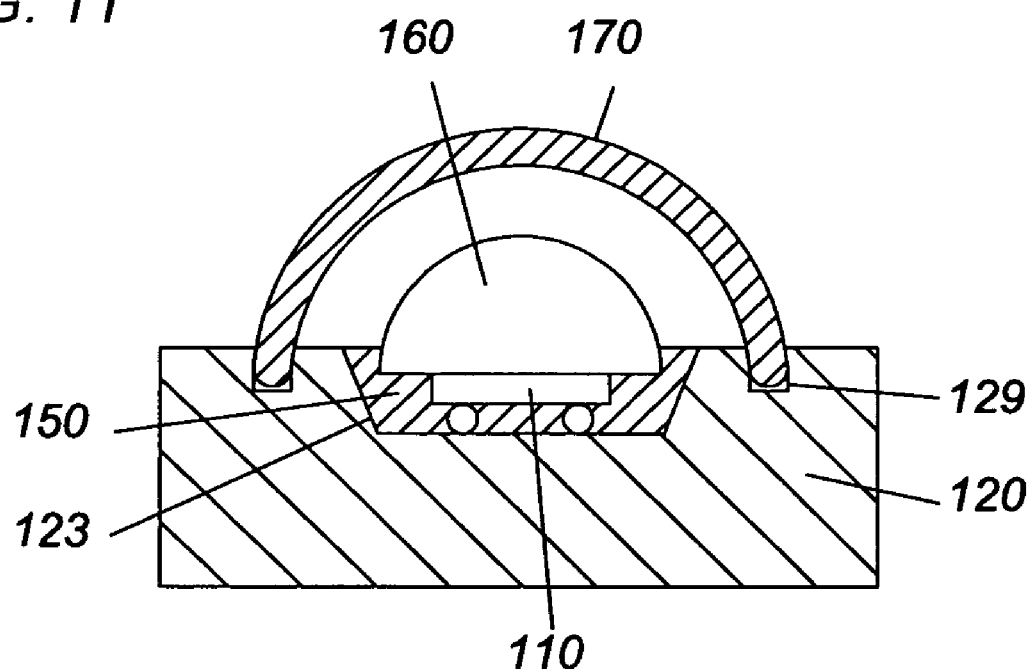
FIG. 11 shows a schematic sectional view of a conventional light emitting device.
Figure 12:
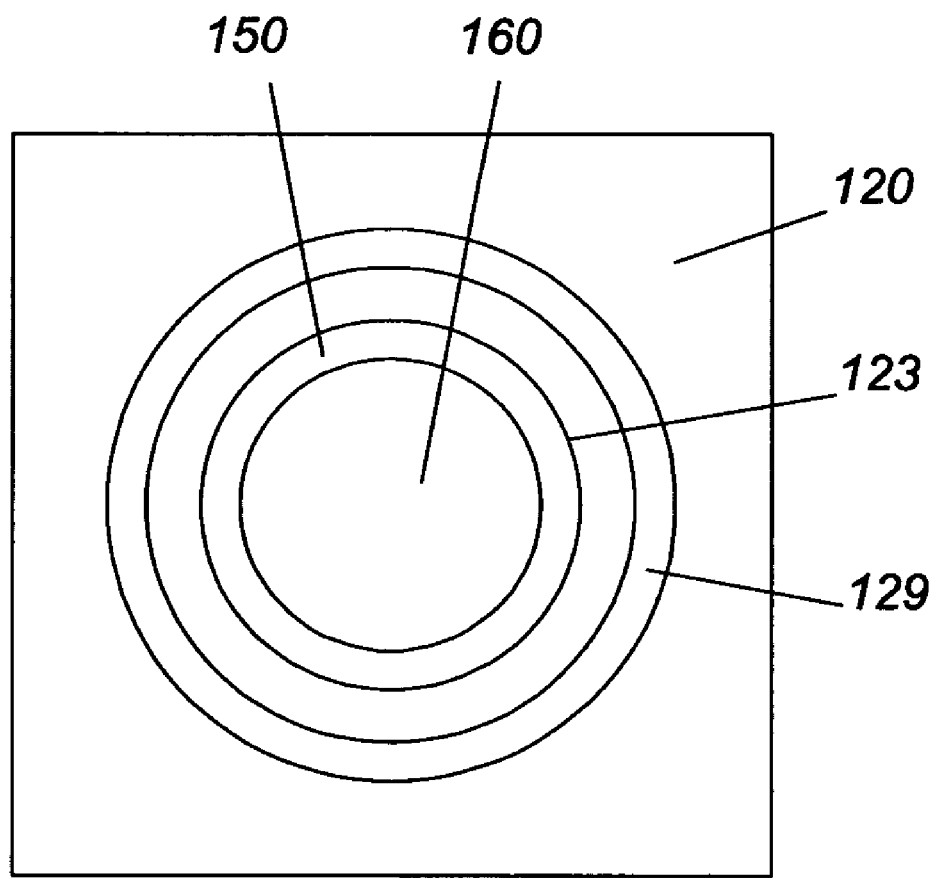
FIG. 12 shows a schematic plane view of essential part of the above conventional light emitting device.
Figure 13:
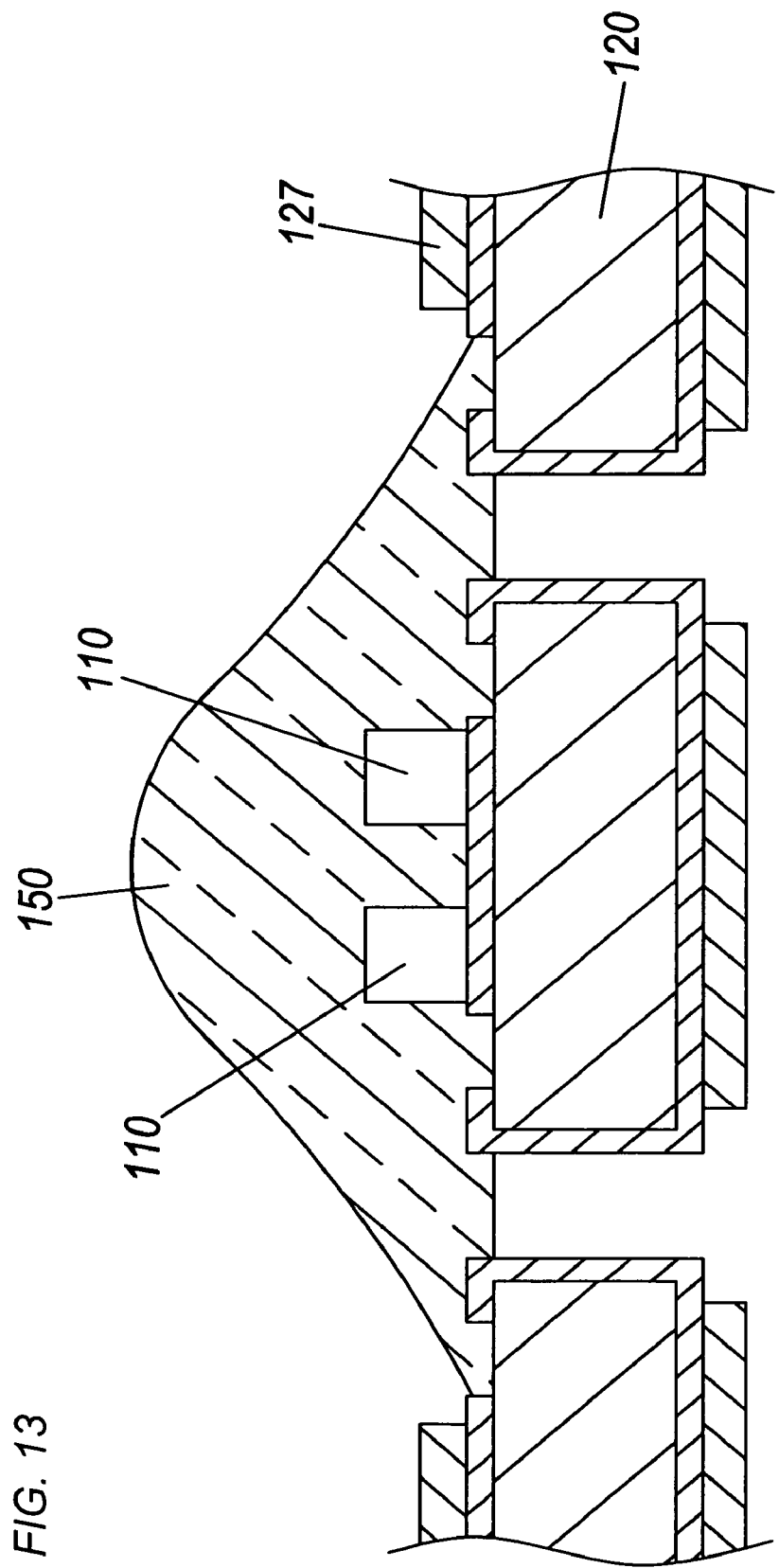
FIG. 13 shows a schematic sectional view of another conventional light emitting device.
Figure 14:
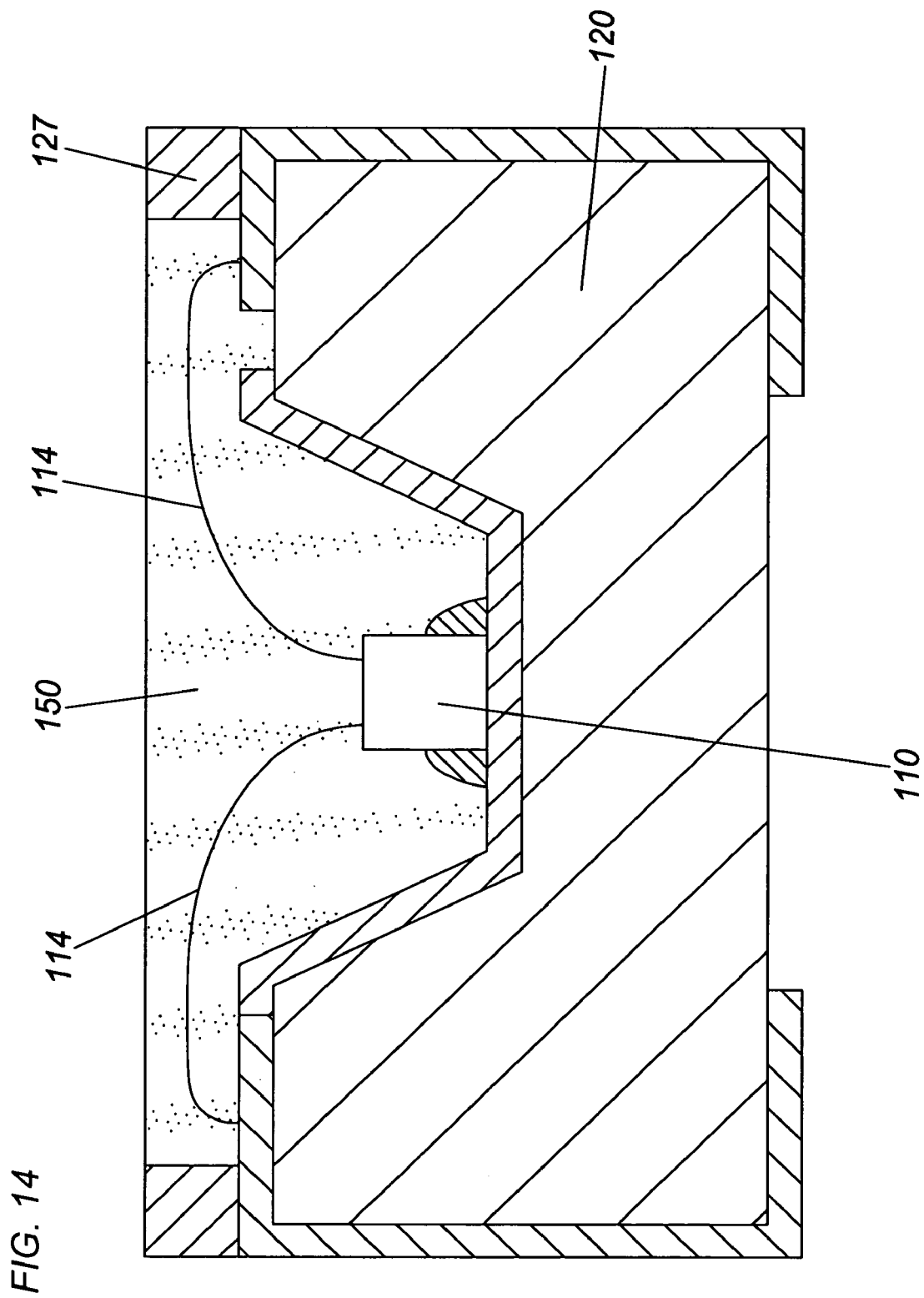
FIG. 14 shows a schematic sectional view of another conventional light emitting device.

As shown in FIG. 10, a curved barrier 25 made of the same material of the ring gate 27 (a white resist in this embodiment) may be formed to separate each electrode 23b,23b from the ring gate 27 on the mounting substrate 20, for the purpose of further preventing the encapsulation resin 50 from flowing to surfaces of the electrodes 23b in fabrication of the light emitting device.

In the above embodiment, a blue-light LED chip is employed as the LED chip 10. The crystal-growth substrate is formed of a SiC substrate, but may be formed of a GaN substrate or a sapphire substrate, instead of the SiC substrate. Both the SiC substrate and the GaN substrate exhibit higher thermal conductivities and lower thermal resistances than the dielectric sapphire substrate. The LED chip 10 is formed at its top surface and its bottom surface with the anode and cathode, respectively. The LED chip 10 may be formed at different surfaces with the anode and cathode, respectively, in which the anode and cathode are respectively connected directly to the patterned conductor 23, 23 by way of the bonding wire 14. The LED chip 10 may be selected to emit red-light, green-light, purple-light or UV-ray, instead of blue-light. The sub-mount member 30 is not necessary, when the difference of coefficient of linear expansion is relatively small between the LED chip 10 and the heat conducting plate 21 of the mounting substrate 20.

The invention claimed is:

1. A light emitting device comprising;
   an LED chip;
   a mounting substrate mounting said LED chip;
   a dome-shaped optical member being secured to a top surface of said mounting substrate to cover said LED chip for directing a light emitted from said LED chip therethrough;
   a light-transmissive encapsulation resin which is filled in a space confined between said optical member and said mounting substrate for encapsulating said LED chip therewith;
   a dome-shaped color conversion member made of a transparent resin material and a phosphor which is excited by a light emitted from said LED chip to emit a light of a color different from a luminescent color of the LED chip, said color conversion member being disposed on the top surface of the mounting substrate to surround said optical member;
   a patterned conductor (23) configured to have electrodes exposed outside of said color conversion member (70) on the top surface of said mounting substrate for electrical connection with said LED chip (10);
   a ring gate (27) which is formed to protrude from the top surface of said mounting substrate (20) to separate said optical member from said electrodes for preventing said encapsulation resin from flowing to said electrode,
   said ring gate being engaged at its outer circumference with said color conversion member to position said color conversion member,
   said ring gate being provided with a plurality of centering projections which are spaced circumferentially along its inner circumference to come into contact with an outer periphery of said optical member.

2. The light emitting device as set forth in claim 1, wherein said color conversion member is formed at inner peripheral bottom rim with a recess for engaging with said ring gate.

3. The light emitting device as set forth in claim 1, wherein said ring gate is formed of a white resist.

4. The light emitting device as set forth in claim 1 wherein said mounting substrate includes a heat conducting plate made of a heat conductive material and a printed substrate provided at its top surface with patterned conductor,
   said heat conducting plate holding a sub-mount member which is configured to mount thereon said LED chip so as to relieve a stress acting on said LED chip due to a difference of coefficient of linear expansion between said LED chip and said heat conducting plate,
   wherein said sub-mount member is disposed directly on a top surface of said heat conducting plate through an opening of said printed substrate and
   wherein the opening is filled with said encapsulation resin around a periphery of said sub-mount member.

5. The light emitting device as set forth in claim 3, wherein said mounting substrate includes a heat conducting plate made of a heat conductive material and a printed substrate provided at its top surface with patterned conductor,
   said heat conducting plate holding a sub-mount member which is configured to mount thereon said LED chip so as to relieve a stress acting on said LED chip due to a difference of coefficient of linear expansion between said LED chip and said heat conducting plate, wherein said sub-mount member is disposed directly on a top surface of said heat conducting plate through an opening of said printed substrate , and wherein the opening is filled with said encapsulation resin around a periphery of said sub-mount member.

6. The light emitting device as set forth in claim 2, wherein said ring gate is formed of a white resist.

7. The light emitting device as set forth in claim 2, wherein said mounting substrate includes a heat conducting plate made of a heat conductive material and a printed substrate provided at its top surface with patterned conductor, said heat conducting plate holding a sub-mount member which is configured to mount thereon said LED chip so as to relieve a stress acting on said LED chip due to a difference of coefficient of linear expansion between said LED chip and said heat conducting plate, wherein said sub-mount member is disposed directly on a top surface of said heat conducting plate through an opening of said printed substrate, and wherein the opening is filled with said encapsulation resin around a periphery of said sub-mount member.

8. The light emitting device as set forth in claim 6, wherein said mounting substrate includes a heat conducting plate made of a heat conductive material and a printed substrate provided at its top surface with patterned conductor, said heat conducting plate holding a sub-mount member which is configured to mount thereon said LED chip so as to relieve a stress acting on said LED chip due to a difference of coefficient of linear expansion between said LED chip and said heat conducting plate, wherein said sub-mount member is disposed directly on a top surface of said heat conducting plate through an opening of said printed substrate , and wherein the opening is filled with said encapsulation resin around a periphery of said sub-mount member.

\* \* \* \* \*